(12) United States Patent
Yoshimoto

(10) Patent No.: US 12,391,477 B2
(45) Date of Patent: Aug. 19, 2025

(54) AUTOMATED WAREHOUSE

(71) Applicant: Daifuku Co., Ltd., Osaka (JP)

(72) Inventor: Tadahiro Yoshimoto, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 347 days.

(21) Appl. No.: 17/977,260

(22) Filed: Oct. 31, 2022

(65) Prior Publication Data
US 2023/0138966 A1   May 4, 2023

(30) Foreign Application Priority Data

Nov. 1, 2021   (JP) .................................. 2021-178752

(51) Int. Cl.
*B65G 1/06*   (2006.01)
*B65G 1/04*   (2006.01)

(52) U.S. Cl.
CPC ............. *B65G 1/06* (2013.01); *B65G 1/0407* (2013.01); *B65G 2203/0208* (2013.01); *B65G 2203/044* (2013.01)

(58) Field of Classification Search
CPC ... H01L 21/67769; B65G 1/0407; B65G 1/06; B65G 1/0421; B65G 1/0478; B65G 2203/0208; B65G 2203/044; B65G 2203/042; B65G 2203/041
USPC ......................................... 414/266, 267, 277
See application file for complete search history.

(56) References Cited

U.S. PATENT DOCUMENTS

| | | | | |
|---|---|---|---|---|
| 2,499,498 | A * | 3/1950 | Hammond, Jr. | ........ E04H 1/005 414/277 |
| 9,025,275 | B1 * | 5/2015 | Manes | ................. G11B 33/027 360/92.1 |
| 2019/0189486 | A1 * | 6/2019 | Abe | .................. H01L 21/67393 |
| 2020/0270061 | A1 * | 8/2020 | Van Wijngaarden | ........................ B65B 69/0058 |

FOREIGN PATENT DOCUMENTS

| JP | 2003171004 A | 6/2003 |
|---|---|---|
| JP | 2008168961 A | 7/2006 |
| JP | 201890391 A | 6/2018 |

* cited by examiner

*Primary Examiner* — Glenn F Myers
(74) *Attorney, Agent, or Firm* — The Webb Law Firm

(57) ABSTRACT

A cover member covers a target region set in a portion of a back face of a storage rack or over an entirety of the back face. Storage regions are respectively formed between pairs of two placement sections adjacent to each other in an up-down direction. The cover member is changeable between a closed state in which the cover member covers the target region and an open state in which the cover member has been moved relative to a frame member to expose the target region. Placement section accessory members are on a back face side in a depth direction relative to storage regions formed on corresponding placement sections, are on a front face side in the depth direction relative to the cover member, and overlap the storage regions as viewed in the depth direction.

6 Claims, 7 Drawing Sheets

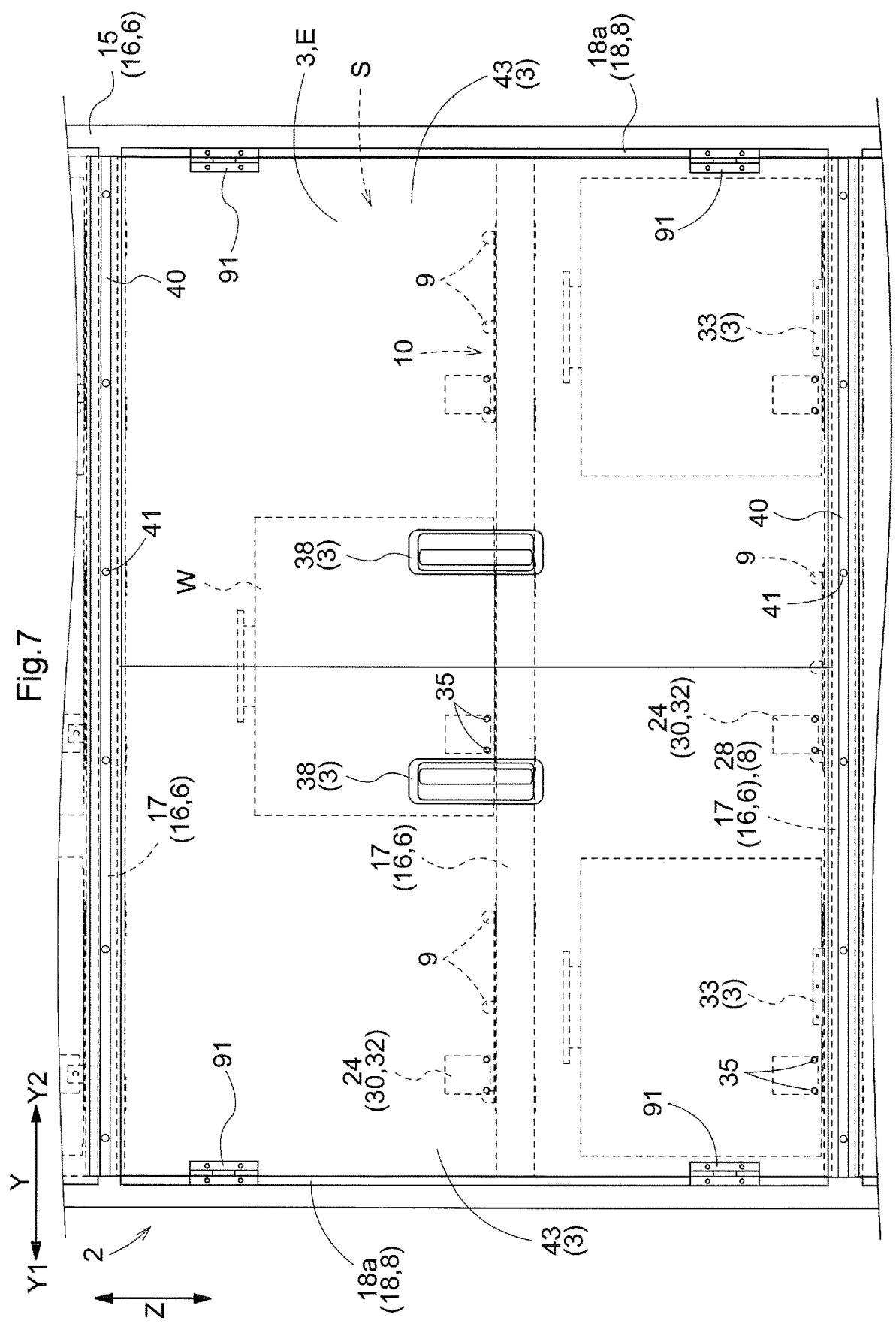

AUTOMATED WAREHOUSE

CROSS-REFERENCE TO RELATED APPLICATION

This application claims priority to Japanese Patent Application No. 2021-178752 filed Nov. 1, 2021, the disclosure of which is hereby incorporated by reference in its entirety.

BACKGROUND OF THE INVENTION

1. Field of the Invention

The present invention relates to an automated warehouse that includes a storage rack capable of storing a plurality of articles and a transport apparatus configured to travel along a front face of the storage rack and transport the articles.

2. Description of the Related Art

JP 2003-171004A discloses an example of such an automated warehouse. In the following description of the related art, reference numerals or names shown in parentheses are those used in JP 2003-171004A.

An automated warehouse (1) described in JP 2003-171004A includes support bodies (21), connecting members (22) connecting the support bodies (21), shelf members (25) fixed to the support bodies (21), outer wall panels (23), and a transport apparatus (4) for placing articles (8) on the shelf members (25). A single outer wall panel (23) is attached to each plane area defined by two support bodies (21) and two connecting members (22). Specifically, side end portions of the outer wall panel (23) are held between the support bodies (21) and retaining members (18), and a lower end portion of the outer wall panel (23) is inserted into an insertion groove (22g) of a connecting member (22). Thus, the outer wall panel (23) is detachably attached to the support bodies (21) and the connecting member (22). This configuration makes it easier to remove the outer wall panels (23) from the automated warehouse (1) compared with a configuration in which the outer wall panels (23) are fixed to the support bodies (21) with use of bolts or the like. Therefore, in case of emergency such as breakdown of the transport apparatus (4) or a power failure, for example, a worker can remove the outer wall panels (23) to take out articles (8) placed on the shelf members (25) directly from the back face side of the automated warehouse (1).

Incidentally, accessory members that are attached to placement sections such as the shelf members (25) for placing articles (8) are sometimes provided between the outer wall panels (23) and articles (8) placed on the shelf members (25), although such accessory members are not provided in the automated warehouse (1) disclosed in JP 2003-171004A. Examples of such accessory members include members constituting various sensors, piping members, wiring members, and reinforcing members for securing the strength of the placement sections. When such accessory members are present, the accessory members may be obstacles and it may be difficult to take out articles (8) from the back face side of the automated warehouse (1).

SUMMARY OF THE INVENTION

Therefore, in view of the foregoing, there is demand for realizing an automated warehouse that allows articles to be taken out from the back face side of a storage rack even if such accessory members are provided.

An automated warehouse according to the present disclosure is characterized in including: a storage rack configured to store a plurality of articles; and a transport apparatus configured to travel along a front face of the storage rack and transport the articles, wherein the storage rack includes: a plurality of placement sections on which the articles are placeable; a frame member supporting the plurality of placement sections; a plurality of placement section accessory members respectively corresponding to the plurality of placement sections; and a cover member, the cover member covers a target region set in a portion of a back face of the storage rack or over an entirety of the back face, the plurality of placement sections are next to each other in both an up-down direction and a width direction orthogonal to the up-down direction as viewed in a depth direction that is a direction from the front face toward the back face or from the back face toward the front face, and storage regions in which the articles are storable are respectively formed between pairs of two placement sections adjacent to each other in the up-down direction, the cover member is changeable between a closed state in which the cover member covers the target region and an open state in which the cover member has been moved relative to the frame member to expose the target region, the placement section accessory members are on a back face side in the depth direction relative to the storage regions formed on the corresponding placement sections, are on a front face side in the depth direction relative to the cover member, and overlap the storage regions as viewed in the depth direction, the back face side in the depth direction being the back face side as seen from the front face side in the depth direction, and the front face side in the depth direction being the front face side as seen from the back face side in the depth direction, and the plurality of placement section accessory members are fixed to the cover member so that the placement section accessory members move relative to the frame member as the state of the cover member is changed from the closed state to the open state.

In general, in a case where the back face of a storage rack is covered with a cover member, it is difficult to take out articles from the storage rack when a transport apparatus has stopped due to breakdown or a power failure, for example. However, according to this configuration, the cover member covering the back face of the storage rack is changeable between the closed state in which the cover member covers the target region relative to the frame member and the open state in which the cover member has been moved relative to the frame member to expose the target region. Accordingly, when the cover member is changed to the open state, articles placed on the placement sections can be taken out from the back face side of the storage rack.

Here, if the placement section accessory members are fixed to the placement sections, the placement section accessory members hinder taking out articles from the back face side. However, according to this configuration, the placement section accessory members are fixed to the cover member and move relative to the frame member as the state of the cover member is changed. Accordingly, when the cover member is in the open state, the placement section accessory members are also shifted from their positions in the closed state relative to the frame member, and do not hinder taking out articles from the back face side of the storage rack.

Therefore, the articles can be taken out relatively easily even in case of emergency, such as a case where the transport apparatus has stopped due to breakdown or a power failure, for example.

Further features and advantages of the automated warehouse will be clarified by exemplary and non-limiting embodiments described below with reference to the drawings.

BRIEF DESCRIPTION OF THE DRAWINGS

FIG. 7 is a partial enlarged view of a back face of a storage rack according to another embodiment.

DESCRIPTION OF THE INVENTION

First Embodiment

First, a first embodiment of an automated warehouse 1 will be described based on the drawings.

1. Automated Warehouse

Figure 1:
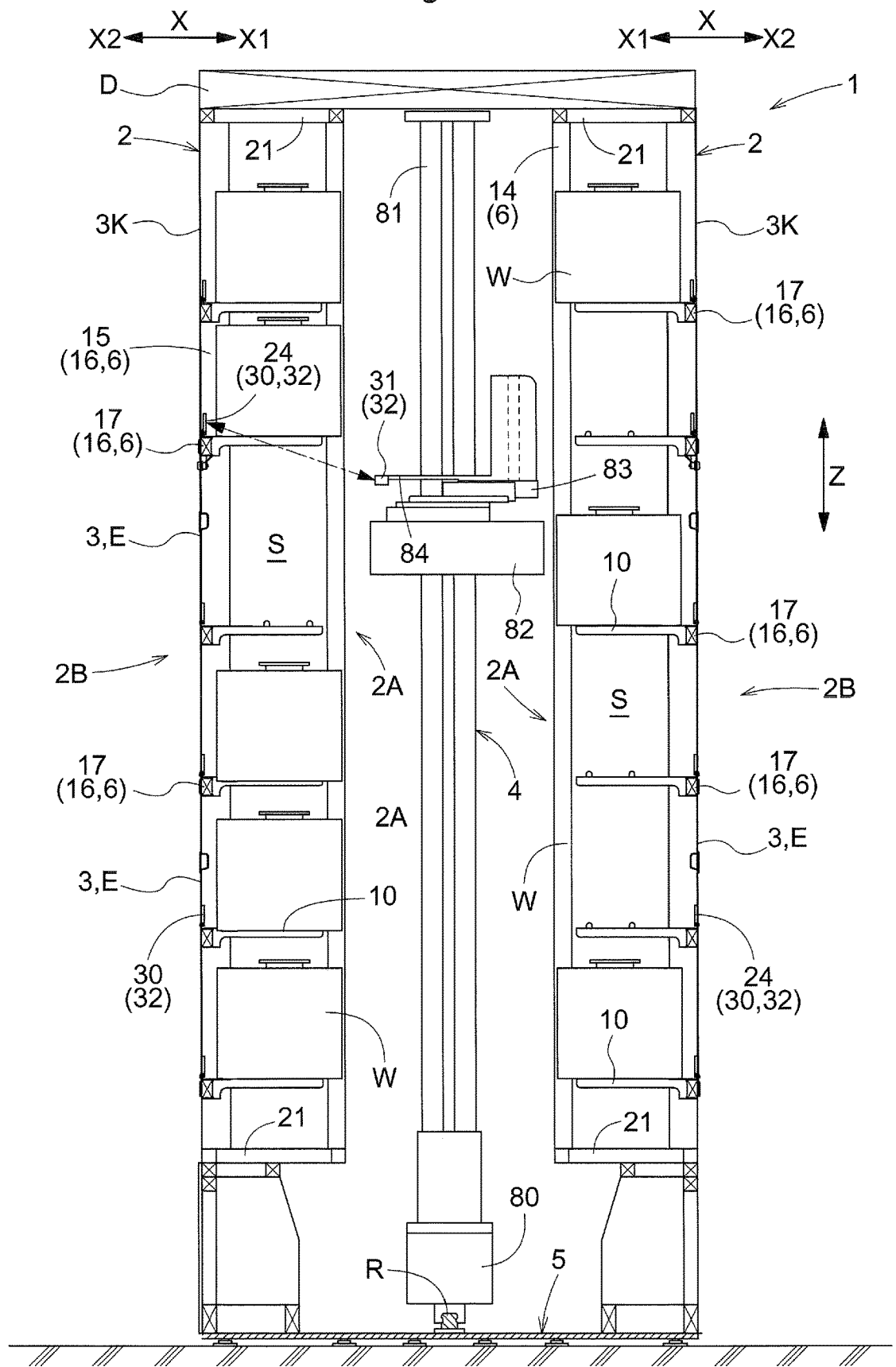
FIG. 1 shows a cross section of an automated warehouse viewed in a width direction.

As shown in FIG. 1, the automated warehouse 1 includes a storage rack 2 capable of storing a plurality of articles W and a transport apparatus 4 configured to travel along a front face 2A of the storage rack 2 and transport articles W. In the illustrated example, the automated warehouse 1 includes a pair of storage racks 2 facing each other with the transport apparatus 4 located therebetween. In the present embodiment, the automated warehouse 1 also includes an article detection sensor 32. In this example, the articles W are FOUPs (Front Opening Unified Pods) for storing semiconductor substrates (wafers).

Figure 2:
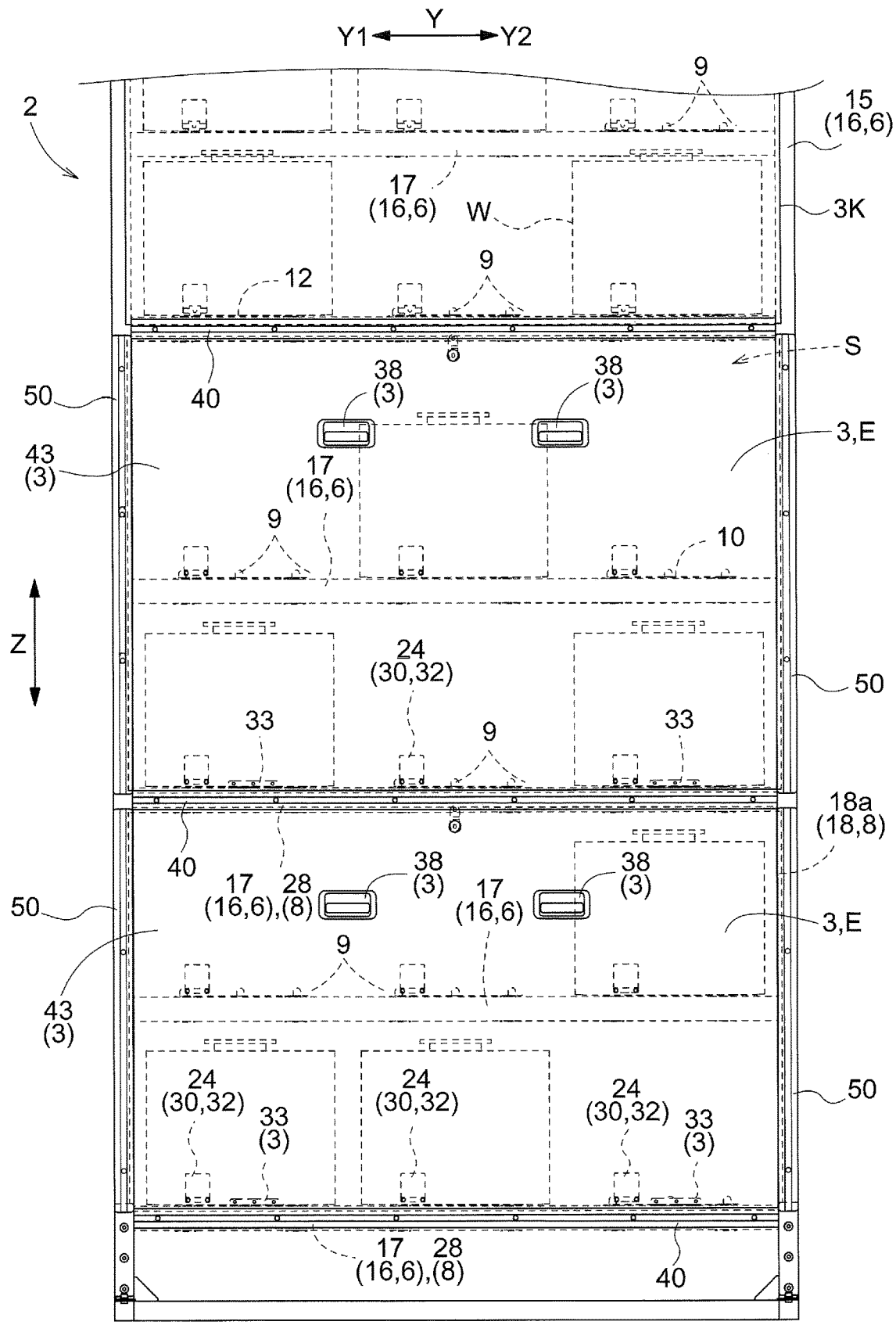
FIG. 2 is a back view of a storage rack.

The following describes each configuration of the automated warehouse 1. As shown in FIGS. 1 and 2, a direction from the front face 2A toward a back face 2B of each of the pair of storage racks 2 or from the back face 2B toward the front face 2A will be referred to as a "depth direction X". A direction orthogonal to an up-down direction Z as viewed in the depth direction X will be referred to as a "width direction Y". The front face 2A side as seen from the back face 2B side in the depth direction X will be referred to as a "front face side X1 in the depth direction", and the back face 2B side as seen from the front face 2A side in the depth direction X will be referred to as a "back face side X2 in the depth direction". Also, one side in the width direction Y will be referred to as a "first side Y1 in the width direction", and the other side will be referred to as a "second side Y2 in the width direction".

2. Transport Apparatus

The transport apparatus 4 in the present embodiment includes a transfer device 83 as shown in FIG. 1. The transfer device 83 holds an article W and transfers the article W between a placement section 10 of the storage racks 2 and the transfer device 83. The transport apparatus 4 moves the transfer device 83 along the front face 2A of each storage rack 2 in both the width direction Y and the up-down direction Z to transport articles W along the front face 2A of the storage rack 2. In this example, the transport apparatus 4 includes, in addition to the transfer device 83, an aisle 5 extending in the width direction Y along the front face 2A of each storage rack 2, a cart 80 configured to travel along the aisle 5, a support 81 fixed to the cart 80, and an elevation body 82 that supports the transfer device 83 and ascends and descends along the support 81 in the up-down direction Z. The cart 80 moves along the width direction Y while being guided by a rail R installed along the aisle 5. As described above, the transport apparatus 4 in this example is a stacker crane. Also, the transport apparatus 4 receives an article W from any placement section 10 of the storage racks 2 whose front faces 2A are facing the aisle 5, and transports the article W to a carry-out port (not shown) for transporting articles W to the outside of the storage racks 2. Also, the transport apparatus 4 receives an article W from a carry-in port (not shown) for transporting articles W from the outside of the storage racks 2, and transports the article W to any placement section 10 of the storage racks 2.

The transfer device 83 is configured to be capable of transferring an article W to any placement section 10 of the pair of storage racks 2 disposed on both sides of the aisle 5 in the depth direction X. Specifically, the transfer device 83 transfers articles W by moving the articles W between the transfer device 83 and transfer target places such as a plurality of placement sections 10 included in the storage racks 2. As described above, the transfer target places for the transfer device 83 include the carry-in port for transporting articles W from the outside of the storage racks 2 and the carry-out port for transporting articles W to the outside of the storage racks 2, in addition to the placement sections 10. In the present embodiment, the transfer device 83 includes a transport support portion 84 configured to support an article W and protrude and retract in the depth direction X. In this example, the transport support portion 84 is configured to support an article W from below. More specifically, the transport support portion 84 includes a plurality of transport protrusions (not shown) that engage with to-be-engaged portions (not shown) of an article W from below, and is configured to support a bottom surface of the article W from below in a state where the plurality of transport protrusions engage with the to-be-engaged portions of the article W from below. In this example, the transfer device 83 is a slide fork-type transfer device.

3. Article Detection Sensor

The article detection sensor 32 detects the presence or absence of an article W placed on a placement section 10 of the storage racks 2. More specifically, the article detection sensor 32 detects the presence or absence of an article W placed on a placement section 10 that has been selected as a transfer target place, in a state where the transfer device 83 of the transport apparatus 4 is at a position corresponding to the placement section 10 as shown in FIG. 1. Here, the "position corresponding to the placement section 10" is a position at which the transfer device 83 transfers an article W between the placement section 10 selected as the transfer target place and the transfer device 83. In this example, the article detection sensor 32 includes a light emitting/receiving portion 31 and reflective plate portions 24. The light emitting/receiving portion 31 is attached to the transport support portion 84 of the transfer device 83. The reflective plate portions 24 are provided in correspondence with the plurality of placement sections 10, at positions on the back face side X2 in the depth direction relative to storage regions S for articles W formed on the respective placement sections 10, and overlap the storage regions S as viewed in the depth direction X. In this example, if no article W is placed on the placement section 10 selected as the transfer target place in a state where the transfer device 83 is at a transfer preparation position corresponding to the placement section 10, light emitted from the light emitting/receiving portion 31 reaches the corresponding reflective plate portion 24, and light reflected off the reflective plate portion 24 is received by the light emitting/receiving portion 31.

Here, the reflective plate portion 24 is formed with use of a retroreflective material that reflects incident light toward a light source. On the other hand, if an article W is placed on the placement section 10 selected as the transfer target place, light emitted from the light emitting/receiving portion 31 is interrupted by the article W and does not reach the corresponding reflective plate portion 24, and accordingly, the light emitting/receiving portion 31 does not receive light. As described above, the article detection sensor 32 detects the presence or absence of an article W placed on the placement section 10 based on whether or not the light emitting/receiving portion 31 receives reflected light.

4. Storage Rack

Each storage rack 2 includes a plurality of placement sections 10 on which articles W are placeable, a frame member 6 supporting the plurality of placement sections 10, placement section accessory members 30 corresponding to the respective placement sections 10, and cover members 3. As shown in FIG. 1, in the present embodiment, the front face 2A of each of the pair of storage racks 2 is on the aisle 5 side and extends along the up-down direction Z and the width direction Y adjacent to the aisle 5. In this example, the pair of storage racks 2 are on both sides of the aisle 5 in the depth direction X. Also, the front faces 2A of the pair of storage racks 2 face each other. In the illustrated example, the automated warehouse 1 further includes an airflow generating device D (see FIG. 1). The pair of storage racks 2 are below the airflow generating device D. The airflow generating device D generates an airflow (downflow) flowing from the upper side toward the lower side in the area in which the storage racks 2 and the transport apparatus 4 are present. Also, the cover members 3 are provided on the back face 2B of each storage rack 2 so as to cover the back face 2B (see FIG. 2). Although described in detail later, the cover members 3 are detachably fixed to the frame member 6. In this example, some of the cover members 3 (the cover member 3 located at the bottom and the second cover member 3 as counted from the bottom) are configured to be easily attachable to and detachable from the frame member 6. Also, the remaining cover members 3 (the third cover member 3 as counted from the bottom and cover members 3 above the third cover member 3) are fixed to the frame member 6 in a manner that is adopted without consideration given to easily detaching the cover members 3. Hereinafter, the cover members 3 configured to be easily attachable and detachable will be simply referred to as "cover members 3", and the other cover members 3 will be referred to as "fixed cover members 3K".

4-1. Placement Section

Figure 4:
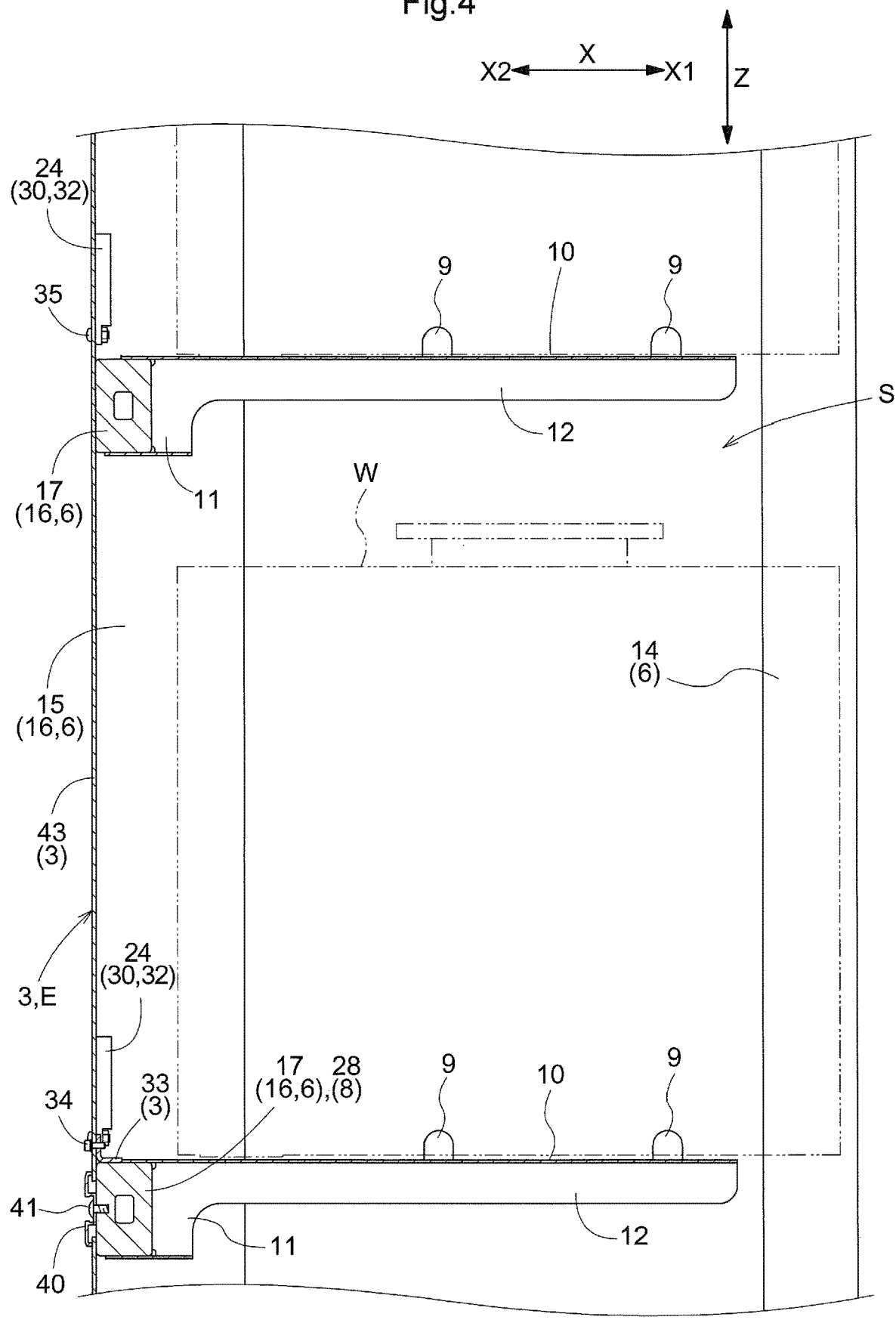
FIG. 4 is a side view showing placement sections and a storage region.

As shown in FIGS. 1 and 2, the plurality of placement sections 10 are next to each other in both the up-down direction Z and the width direction Y. Also, storage regions S in which articles W are storable are respectively formed between pairs of two placement sections 10 adjacent to each other in the up-down direction Z. In the present embodiment, each of the plurality of placement sections 10 is supported by the frame member 6 in a cantilever manner from the back face side X2 in the depth direction. Specifically, each of the plurality of placement sections 10 is supported by a back-face-side frame portion 16, which will be described later. Each of the plurality of placement sections 10 is configured to allow an article W to be placed in and taken out from the corresponding storage region S from the front face side X1 in the depth direction. As shown in FIG. 4, in this example, each of the plurality of placement sections 10 includes a support body 12 configured to support a stored article W from below and a fixed portion 11 fixed to the back-face-side frame portion 16. Here, the support body 12 and the fixed portion 11 are formed as a single piece and constituted by the same member. The support body 12 includes a plurality of storage protrusions 9 that engage with to-be-engaged portions (not shown) of the article W from below. The support body 12 is configured to support the bottom surface of the article W from below in a state where the storage protrusions 9 engage with the to-be-engaged portions of the article W from below.

4-2. Frame Member

As shown in FIGS. 1 and 2, in the present embodiment, the frame member 6 includes the back-face-side frame portions 16 on the back face side X2 in the depth direction relative to the plurality of storage regions S. In this example, the back-face-side frame portions 16 include a plurality of back-face-side supports 15 and a plurality of beams 17 on the back face side X2 in the depth direction relative to the storage regions S. The beams 17 extend along the width direction Y and connect a pair of back-face-side supports 15 adjacent to each other in the width direction Y. The plurality of beams 17 are arranged separately from each other at constant intervals in the up-down direction Z. In this example, the frame member 6 includes, in addition to the back-face-side frame portions 16, a plurality of front-face-side supports 14 on the front face side X1 in the depth direction relative to the storage regions S. The positions of the front-face-side supports 14 in the width direction Y correspond to the back-face-side supports 15. The front-face-side supports 14 are connected to the back-face-side supports 15 by connecting beams 21 at a plurality of positions in the up-down direction Z. The connecting beams 21 extend along the depth direction X and connect the front-face-side supports 14 and the back-face-side supports 15 disposed at corresponding positions in the width direction Y.

In the present embodiment, the plurality of placement sections 10 are supported by the back-face-side frame portions 16 in a cantilever manner. Specifically, the fixed portions 11 of the placement sections 10 are fixed to the respective of beams 17. The placement sections 10 are supported by the back-face-side frame portions 16 and protrude from the back-face-side frame portions 16 toward the front face side X1 in the depth direction. In this example, a plurality of placement sections 10 arranged side by side in the width direction Y are supported by a single beam 17. In the illustrated example, each beam 17 supports three placement sections 10 arranged side by side in the width direction Y (see FIG. 2).

In the present embodiment, the frame member 6 is provided with a positioning mechanism 8 that defines an attachment position of each cover member 3. Although described in detail later, the cover members 3 cover the back face 2B of the storage rack 2 and are configured to be detachable from and attachable to the frame member 6. Since the positioning mechanism 8 for the cover members 3 is provided on the frame member 6, each cover member 3 can be kept from being displaced from a proper position when attached again after removed once. In the present embodiment, the positioning mechanism 8 includes first positioning members 18 that define the attachment position of the cover member 3 relative to the frame member 6 in the width direction Y and a second positioning member 28 that defines the attachment position of the cover member 3 relative to the frame member 6 in the up-down direction Z. The following specifically describes the first positioning members 18 and the second positioning member 28.

Figure 3:
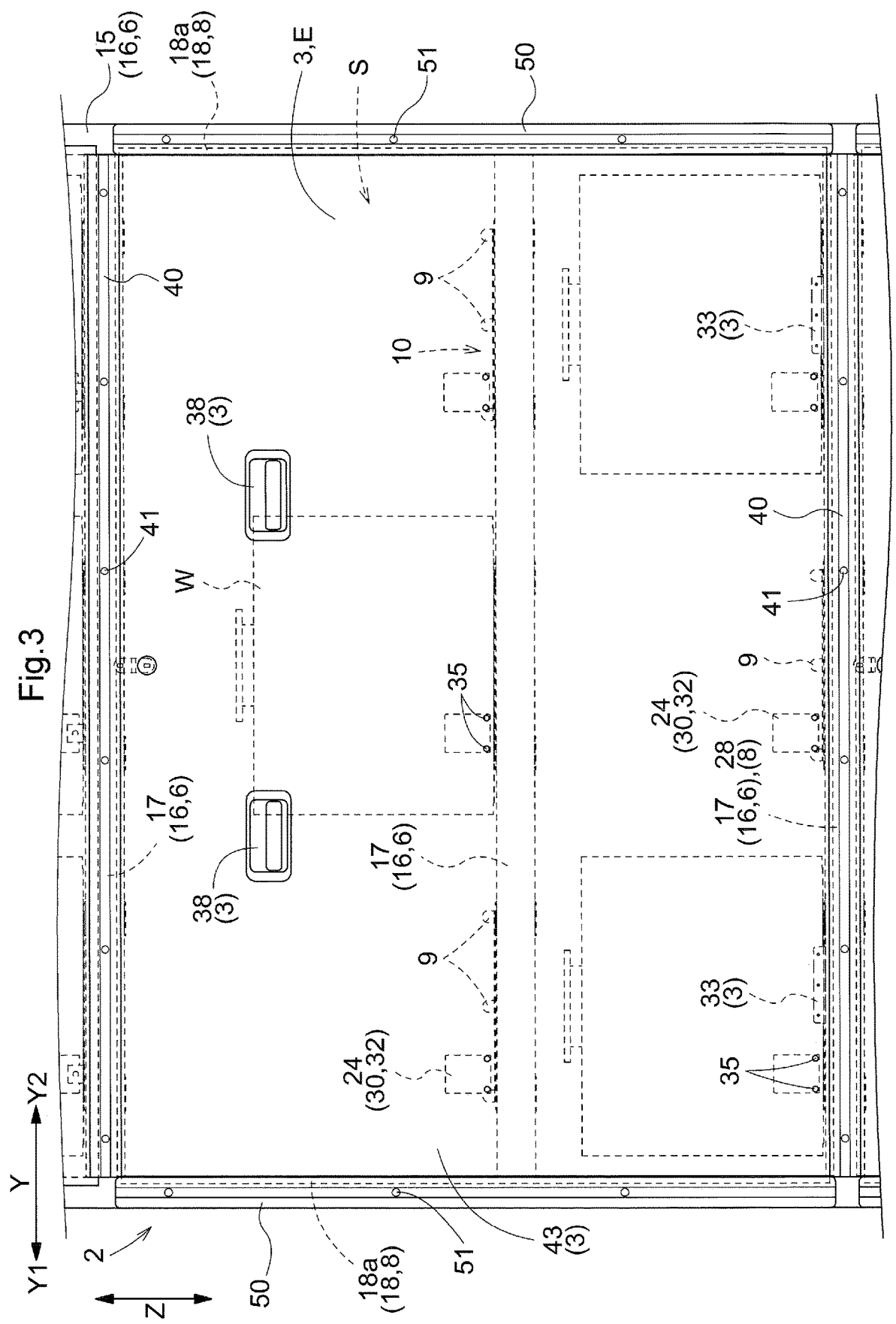
FIG. 3 is a partial enlarged view of a back face of the storage rack.

As shown in FIG. 3, in the present embodiment, the first positioning members 18 are provided on the back-face-side frame portions 16. The first positioning members 18 include widthwise abutting surfaces 19 that respectively abut against two side edges of the cover member 3 in the width direction Y. In this example, the first positioning members 18 include a pair of elongated members 18a extending in the up-down direction Z. Here, a single elongated member 18a is attached to each of a pair of back-face-side supports 15 supporting a single cover member 3. Accordingly, elongated members 18a are disposed on both sides of the single cover member 3 in the width direction Y In the state where the cover member 3 is attached to the frame member 6, surfaces of the elongated members 18a facing the cover member 3 serve as the widthwise abutting surfaces 19 of the first positioning members 18 and respectively abut against the two side edges of the cover member 3 in the width direction Y.

In the present embodiment, the pair of elongated members 18a are overlaid on the pair of back-face-side supports 15 spaced apart from each other in the width direction Y, from the back face side X2 in the depth direction. As shown in FIG. 3, in this example, the second side Y2 edge in the width direction of an elongated member 18a is overlaid on the back-face-side support 15 disposed on the first side Y1 in the width direction in such a manner as to extend along the second side Y2 edge in the width direction of the back-face-side support 15. Likewise, the first side Y1 edge in the width direction of an elongated member 18a is overlaid on the back-face-side support 15 disposed on the second side Y2 in the width direction in such a manner as to extend along the first side Y1 edge in the width direction of the back-face-side support 15.

Figure 6:
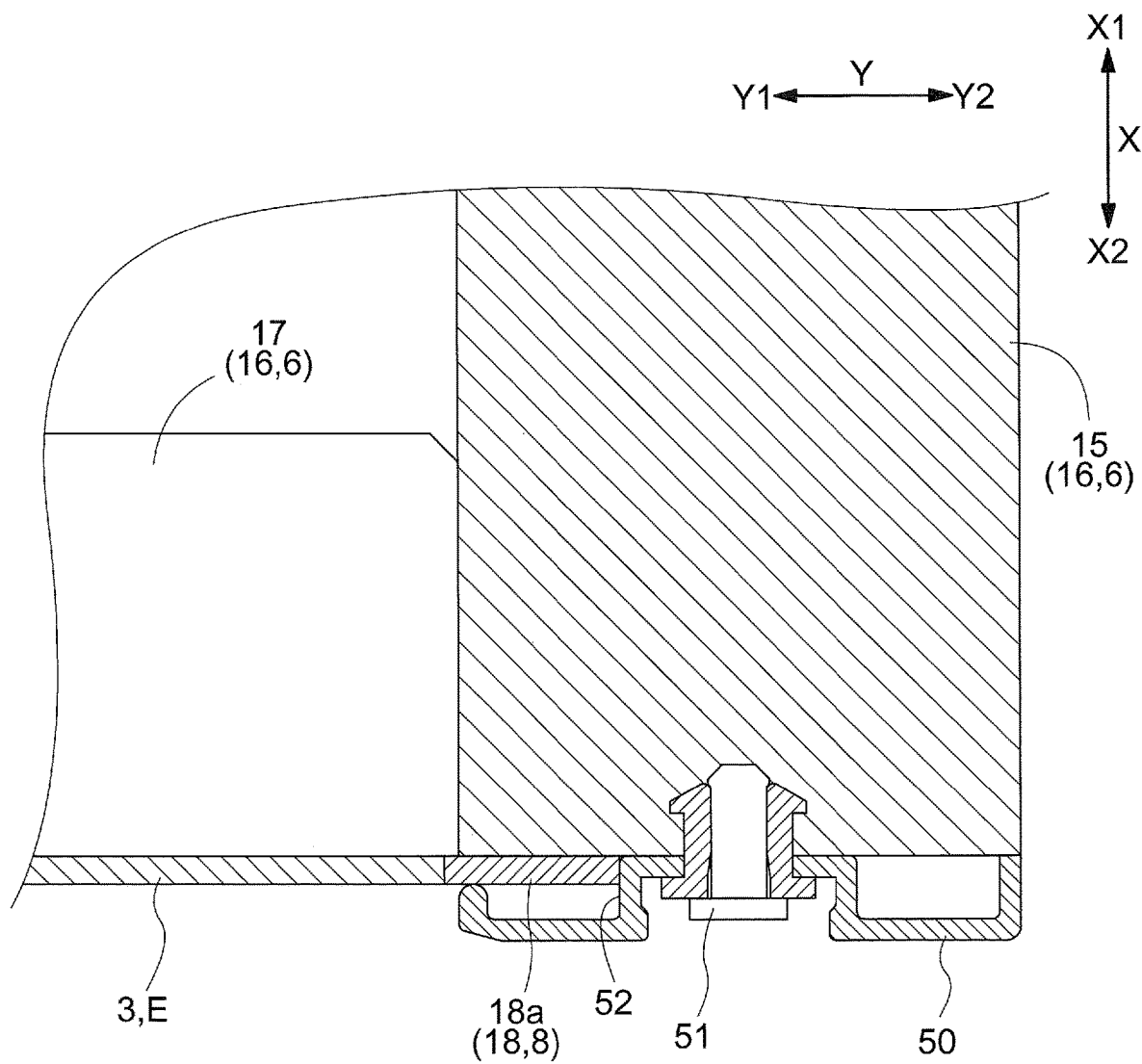
FIG. 6 is a partial enlarged view showing a positional relationship between a first positioning member, a frame member, and the cover member viewed in an up-down direction.

Also, in this example, a first retaining member 50 for fixing each elongated member 18a to the corresponding back-face-side support 15 and defining an attachment position of the elongated member 18a in the width direction Y is attached to each of the pair of back-face-side supports 15. As shown in FIGS. 3 and 6, the first retaining member 50 is fixed to a surface of the corresponding back-face-side support 15, which surface faces the back face side X2 in the depth direction, with use of a first fastening member 51.

The first retaining member 50 is configured in such a manner that the elongated member 18a is held between the first retaining member 50 and the back-face-side support 15 in the depth direction X when the first fastening member 51 is tightened. Thus, the elongated member 18a is fixed to the back-face-side support 15. Furthermore, the first retaining member 50 includes a first retaining member abutting surface 52 that abuts against the elongated member 18a in the width direction Y. The attachment position of the elongated member 18a in the width direction Y is defined due to the elongated member 18a abutting against the first retaining member abutting surface 52. Specifically, the elongated member 18a on the back-face-side support 15 disposed on the first side Y1 in the width direction abuts against the first retaining member abutting surface 52 of the first retaining member 50, which faces the second side Y2 in the width direction. The elongated member 18a on the back-face-side support 15 disposed on the second side Y2 in the width direction abuts against the first retaining member abutting surface 52 of the first retaining member 50, which faces the first side Y1 in the width direction. As described above, the first positioning members 18 are positioned in the width direction Y and fixed with use of the first retaining members 50. Note that, in the example shown in FIGS. 2 and 3, each cover member 3 is provided with a pair of elongated members 18a and a pair of first retaining members 50.

Figure 5:
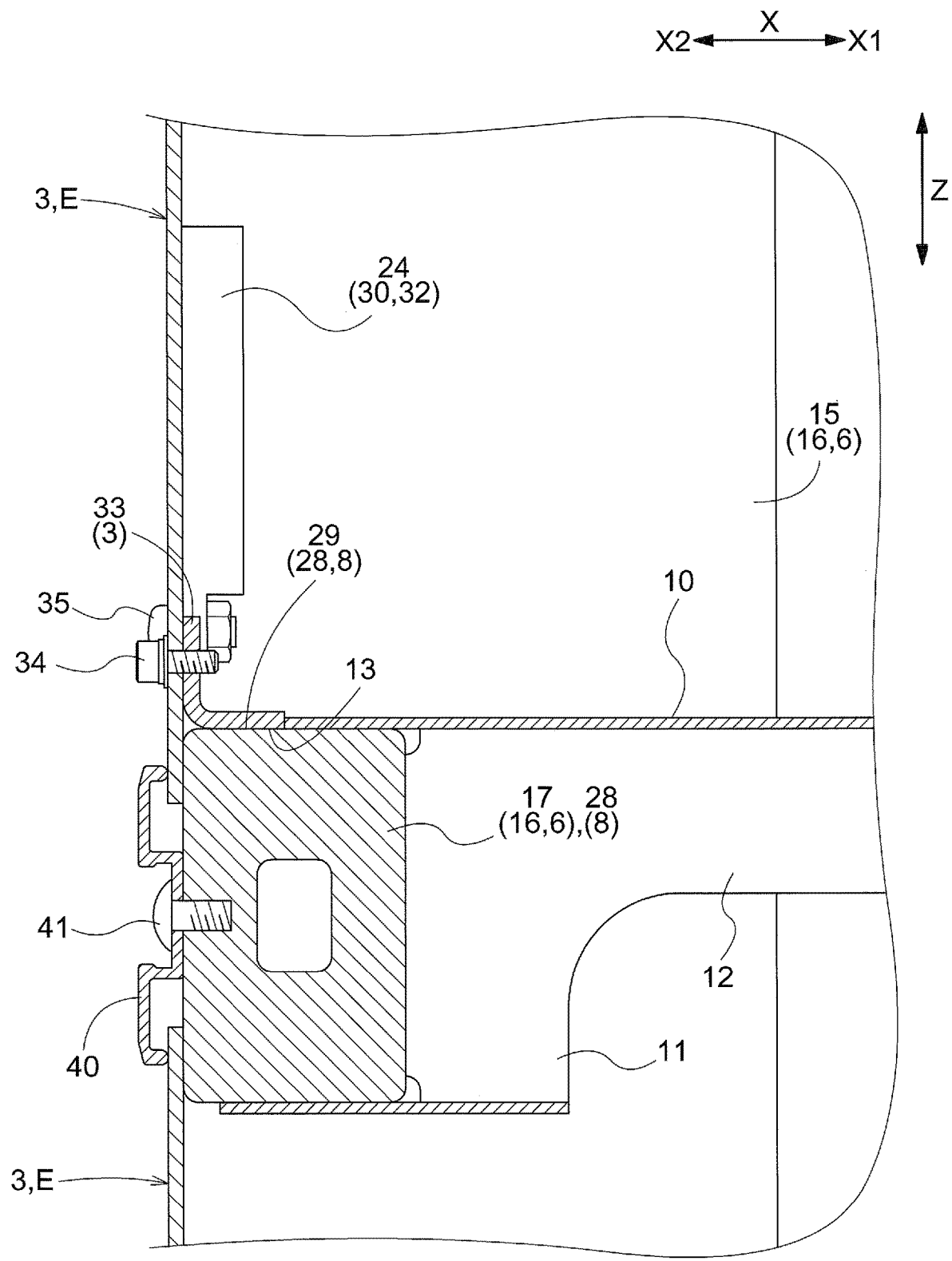
FIG. 5 is a partial enlarged view showing a positional relationship between a cover member and a back-face-side frame member viewed in the width direction.

As shown in FIGS. 3 and 5, in the present embodiment, the second positioning member 28 is a beam 17 that is located at a position corresponding to a lower end portion of the cover member 3, out of the plurality of beams 17 constituting the back-face-side frame portions 16. Specifically, the beam 17 overlaps the lower end portion of the cover member 3 as viewed in the depth direction X. The second positioning member 28 includes a support surface 29 facing upward and configured to support a downward-facing supported surface 13 of the cover member 3. In this example, in the state where the cover member 3 is attached to the back-face-side frame portions 16, an upward-facing surface of the beam 17 located at the position corresponding to the lower end portion of the cover member 3 abuts against the supported surface 13 of the cover member 3 from below. This upward-facing surface of the beam 17 serves as the support surface 29 of the second positioning member 28. As described above, the second positioning member 28 supports the cover member 3 from below and defines the attachment position of the cover member 3 in the up-down direction Z.

4-3. Cover Member

The cover members 3 cover target regions E set in a portion of the back face 2B of the storage rack 2 or over an entirety of the back face 2B. As shown in FIG. 2, in the present embodiment, the cover members 3 cover target regions E set in a portion of the back face 2B of the storage rack 2. All the target regions E of the back face 2B are covered by attaching the plurality of cover members 3 to the back face 2B. In this example, the plurality of cover members 3 are next to each other in the up-down direction Z on the back face 2B. In this example, the plurality of cover members 3 are next to each other in the up-down direction Z, but a configuration is also possible in which the plurality of cover members 3 are side by side in the width direction Y, for example.

As shown in FIGS. 1 and 2, each cover member 3 is changeable between a closed state in which the cover member 3 covers a corresponding target region E and an open state in which the cover member 3 has been moved relative to the frame member 6 to expose the target region E. In the present embodiment, the cover members 3 are detachably fixed to the frame member 6. More specifically, the cover members 3 are detachably fixed to the back-face-side frame portions 16. That is, each cover member 3 covers the corresponding target region E in the closed state when attached to the back-face-side frame portions 16 and exposes the target region E in the open state when removed from the back-face-side frame portions 16. In this example, the cover members 3 are fixed to the back-face-side frame portions 16 from the back face side X2 in the depth direction.

Note that, in the illustrated example, the two cover members 3 other than the fixed cover members 3K are fixed in such a manner as to be easily detachable from the back-face-side frame portions 16 as described above.

In this example, each cover member 3 includes a cover main body portion 43, a supported portion 33, and a handle portion 38. The handle portion 38 is gripped by a worker or the like when the cover member 3 is to be removed from the storage rack 2. The handle portion 38 is fixed to the cover main body portion 43. In the illustrated example, two handle portions 38 are provided side by side in the width direction Y on each cover member 3 (see FIG. 2).

The supported portion 33 is provided in a lower end portion of the cover main body portion 43. Specifically, the supported portion 33 protrudes toward the front face side X1 in the depth direction from a surface of the cover main body portion 43, which surface faces the front face side X1 in the depth direction. Also, the supported portion 33 is fixed to the surface of the cover main body portion 43, which faces the front face side X1 in the depth direction. The supported portion 33 includes the supported surface 13 described above, which abuts against the support surface 29 of the second positioning member 28 (beam 17 located at the position corresponding to the lower end portion of the cover member 3) from above. In this example, each cover member 3 includes a plurality of supported portions 33. In the illustrated example, each cover member 3 includes two supported portions 33 provided separately from each other in the width direction Y. The supported portions 33 are fixed to the cover main body portion 43 with use of second fastening members 34. In this example, each supported portion 33 is constituted by a plate-shaped member that is bent into an L-shape as viewed in the width direction Y. One of two outer faces of the supported portion 33 is in contact with the surface of the cover main body portion 43 that faces the front face side X1 in the depth direction and is fixed to the cover main body portion 43, and the other outer face of the supported portion 33 serves as the downward-facing supported surface 13.

Note that an L-shaped angle member can be used as such a supported portion 33, for example.

The cover main body portion 43 is a plate-shaped member. The cover main body portion 43 covers a portion of the back face 2B of the storage rack 2. Also, the cover main body portion 43 covers a plurality of storage regions S as viewed in the depth direction X. Specifically, the cover main body portion 43 of a single cover member 3 covers a plurality of storage regions S formed next to each other in the width direction Y and the up-down direction Z (see FIG. 3). Accordingly, in this example, the cover main body portion 43 has a rectangular plate-shape as viewed in the depth direction X. In the illustrated example, the cover main body portion 43 of the single cover member 3 is configured to cover a total of six storage regions S arranged in three columns in the width direction Y and in two rows in the up-down direction Z.

As shown in FIGS. 3 and 5, in the present embodiment, the storage rack 2 further includes second retaining members 40. The second retaining members 40 are members for restricting movement of the cover member 3 in the depth direction X in the state where the cover member 3 is attached to the frame member 6. The second retaining members 40 are attached to beams 17 of the back-face-side frame portions 16 at positions respectively corresponding to an upper end portion and the lower end portion of the cover member 3. In this example, the second retaining members 40 are configured to sandwich the upper end and the lower end of the cover main body portion 43 between the second retaining members 40 and the beams 17. In this example, each second retaining member 40 is formed as a band that is elongated in the width direction Y. The second retaining members 40 are fixed to surfaces of the beams 17, which surfaces face the back face side X2 in the depth direction, with use of third fastening members 41. Each second retaining member 40 holds at least one of the upper end and the lower end of the cover main body portion 43 between the second retaining member 40 and the corresponding back-face-side frame portion 16 when the third fastening members 41 are tightened. In the example shown in FIG. 2, the second retaining members 40 are fixed to the beam 17 (second positioning member 28) located at a position corresponding to the lower end portion of the cover member 3 located at the bottom, the beam 17 (second positioning member 28) located at a position corresponding to the upper end portion of the cover member 3 located at the bottom and the lower end portion of the second cover member 3 as counted from the bottom, and the beam 17 located at a position corresponding to the upper end portion of the second cover member 3 as counted from the bottom. The second retaining member 40 at the position corresponding to the lower end portion of the cover member 3 located at the bottom holds the lower end of that cover member 3 between the second retaining member 40 and the corresponding beam 17. The second retaining member 40 at the position corresponding to the upper end portion of the cover member 3 located at the bottom and the lower end portion of the second cover member 3 as counted from the bottom holds the upper end of the cover member 3 located at the bottom and the lower end of the second cover member 3 between the second retaining member 40 and the corresponding beam 17. The second retaining member 40 at the position corresponding to the upper end portion of the second cover member 3 as counted from the bottom holds the upper end of the second cover member 3 between the second retaining member 40 and the corresponding beam 17.

In this example, when a cover member 3 is to be removed from the frame member 6, the tightened third fastening members 41 are loosened to cancel the state where the upper end and the lower end of the cover main body portion 43 are held between the second retaining members 40 and the beams 17. Thus, restriction of the movement of the cover member 3 toward the back face side X2 in the depth direction relative to the frame member 6 is canceled. Then, when the cover member 3 is lifted by a worker or the like gripping the handle portions 38, the state where the supported surface 13 is supported by the second positioning member 28 is canceled. Thereafter, the cover member 3 is moved toward the back face side X2 in the depth direction relative to the frame member 6 by the worker or the like to be removed from the frame member 6. When the cover member 3 is removed from the frame member 6 as described above, an article W placed on the placement section 10 can be taken out from the back face 2B side of the storage rack 2.

4-4. Placement Section Accessory Member

As shown in FIGS. 3 and 4, each placement section accessory member 30 is on the back face side X2 in the depth direction relative to the storage region S formed on the corresponding placement section 10, is on the front face side X1 in the depth direction relative to the cover member 3, and overlaps the storage region S as viewed in the depth direction X. That is, the placement section accessory members 30 are disposed between the cover member 3 and the storage regions S.

Also, the plurality of placement section accessory members 30 are fixed to the cover member 3 so that the placement section accessory members 30 move relative to the frame member 6 as the state of the cover member 3 is changed from the closed state to the open state. Accordingly, when the state of the cover member 3 is changed from the closed state to the open state, the placement section accessory members 30 also move relative to the frame member 6 from their positions in the closed state. Specifically, when the state of the cover member 3 is changed to the open state, the placement section accessory members 30 move to positions at which the placement section accessory members 30 do not overlap the storage regions S as viewed in the depth direction X, or even if the placement section accessory members 30 overlap the storage regions S as viewed in the depth direction X, the placement section accessory members 30 are sufficiently spaced apart from the storage regions S and allow articles W to be taken out from the storage regions S. As shown in FIG. 3, in the present embodiment, the placement section accessory members 30 are attached to the surface of the cover member 3, which surface faces the front face side X1 in the depth direction, at positions respectively corresponding to the plurality of placement sections 10. Specifically, the placement section accessory members 30 are attached to the surface of the cover main body portion 43 that faces the front face side X1 in the depth direction. Also, the placement section accessory members 30 are attached to the cover main body portion 43 in a state of being arranged next to each other in the up-down direction Z and the width direction Y to correspond to the plurality of placement sections 10. Accordingly, the same number of (six in the illustrated example) placement section accessory members 30 as the storage regions S covered with the single cover member 3 are attached to the cover main body portion 43 of the single cover member 3. According to this configuration, when the cover member 3 is attached to the frame member 6, the plurality of placement section accessory members 30 are disposed at the positions respectively corresponding to the plurality of placement sections 10. In other words, when the cover member 3 is in the closed state, the plurality of placement section accessory members 30 are at the positions respectively corresponding to the plurality of placement sections 10.

In this example, in the state where the cover member 3 is attached to the frame member 6, the positions of the placement section accessory members 30 are shifted from the supported portions 33 in the width direction Y as shown in FIG. 3. In the illustrated example, each of the plurality of placement section accessory members 30 is fixed to the surface of the cover main body portion 43 that faces the front face side X1 in the depth direction with use of fourth fastening members 35. Note that the placement section accessory members 30 may be fixed to the placement sections 10 or the fixed cover members 3K in the region of the back face 2B of the storage rack 2 in which the fixed cover members 3K are provided.

In the present embodiment, the placement section accessory members 30 constitute the article detection sensor 32 for detecting the presence or absence of articles W placed on the placement sections 10. In this example, the placement section accessory members 30 correspond to the reflective plate portions 24 constituting the article detection sensor 32. That is, the reflective plate portions 24 are attached to the cover main body portion 43 at the positions corresponding to the respective placement sections 10. With this configuration, the reflective plate portions 24 cooperate with the light emitting/receiving portion 31 provided in the transfer device 83 and function as the article detection sensor 32. Specifically, each reflective plate portion 24 is attached to the surface of the cover main body portion 43 that faces the front face side X1 in the depth direction, at a position at which the reflective plate portion 24 receives light emitted from the light emitting/receiving portion 31 in the state where the transfer device 83 is at the transfer preparation position. In this example, the reflective plate portion 24 is fixed to the cover member 3 as described above, and accordingly, the reflective plate portion 24, which is the placement section accessory member 30, can be removed together with the cover member 3 so as not to hinder taking out an article W from the back face 2B side of the storage rack 2. In this manner, the placement section accessory members 30 move to positions at which the placement section accessory members 30 do not overlap the storage regions S as viewed in the depth direction X, or even if the placement section accessory members 30 overlap the storage regions S as viewed in the depth direction X, the placement section accessory members 30 are sufficiently spaced apart from the storage regions S and allow articles W to be taken out from the storage regions S.

Second Embodiment

Next, a second embodiment of the automated warehouse will be described with reference to a drawing (FIG. 7). The following mainly describes differences of the automated warehouse of the present embodiment from the first embodiment. Matters that are not particularly mentioned are the same as those in the first embodiment. The same configurations as those in the first embodiment are denoted by the same reference signs as those used in the first embodiment, and detailed descriptions thereof are omitted.

As shown in FIG. 7, in the present embodiment, the cover member 3 is swingably supported by the back-face-side frame portion 16. In this example, the cover member 3 is supported by the back-face-side support 15 in such a manner as to be rotatable about an up-down axis extending along the up-down direction Z. Specifically, the cover member 3 is attached to the elongated member 18a (first positioning member 18), which is fixed to the back-face-side support 15, via hinges 91. The cover member 3 turns about the up-down axis of the hinges 91, and thus the state of the cover member 3 changes between the closed state in which the cover member 3 covers the target region E and the open state in which the target region E is exposed. As described above, the cover member 3 in this example functions as a door. In the illustrated example, each of the pair of back-face-side supports 15 supports a single cover member 3. In the closed state of the cover members 3 (state where the cover members 3 are closed), surfaces of the pair of cover members 3 facing inward in width direction abut against each other. Thus, the entire target region E is covered with the pair of cover members 3 (see FIG. 7). Each of the pair of cover members 3 is provided with a handle portion 38. As described above, the pair of cover members 3 in the illustrated example are configured as a double door. Note that a configuration is also possible in which a single cover member 3 is attached to only one of the pair of back-face-side supports 15 via the hinges 91, and the entire target region E is covered with the single cover member 3 (single swing door) in the closed state of the cover member 3. Alternatively, a configuration is also possible in which the cover member 3 is slidable in the width direction Y relative to the back-face-side frame portions 16, and the state of the cover member 3 is changed between the closed state and the open state by sliding the cover member 3 in the width direction Y.

In the present embodiment as well, a plurality of placement section accessory members 30 are fixed to the cover member 3 so that the placement section accessory members 30 move relative to the frame member 6 as the state of the cover member 3 is changed from the closed state to the open state. In this example, a plurality of placement section accessory members 30 are attached to each of the pair of cover members 3. Specifically, the plurality of placement section accessory members 30 are attached to the surface of each cover member 3, which surface faces the front face side X1 in the depth direction, at positions respectively corresponding to a plurality of placement sections 10. Here, when the cover member 3 is in the closed state, each placement section accessory member 30 is on the back face side X2 in the depth direction relative to the storage region S formed on the corresponding placement section 10, is on the front face side X1 in the depth direction relative to the cover member 3, and overlaps the storage region S as viewed in the depth direction X. When the state of the cover member 3 is changed from the closed state to the open state, the placement section accessory members 30 also move relative to the frame member 6 from their positions in the closed state. Specifically, when the state of the cover member 3 is changed to the open state, the placement section accessory members 30 move to positions at which the placement section accessory members 30 do not overlap the storage regions S as viewed in the depth direction X, or even if the placement section accessory members 30 overlap the storage regions S as viewed in the depth direction X, the placement section accessory members 30 are sufficiently spaced apart from the storage regions S and allow articles W to be taken out from the storage regions S.

5. Other Embodiments

Next, other embodiments of the automated warehouse will be described.

(1) In the above embodiment, a configuration is described as an example in which each of the plurality of cover members 3 detachably fixed to the frame member 6 covers a portion of the back face 2B of the storage rack 2. However, there is no limitation to this configuration, and a configuration is also possible in which the entire back face 2B of the storage rack 2 is covered with the plurality of cover members 3 detachably fixed to the frame member 6. Alternatively, a configuration is also possible in which the entire back face 2B of the storage rack 2 is covered with a single cover member 3 detachably fixed to the frame member 6. Such a configuration is preferred in a case where the storage rack 2 is relatively small, for example.

(2) In the above embodiment, a configuration is described as an example in which the frame member 6 is provided with the positioning mechanism 8 that defines the attachment position of each cover member 3. However, there is no limitation to this configuration, and a configuration is also possible in which the frame member 6 is not provided with the positioning mechanism 8.

(3) In the above embodiment, a configuration is described as an example in which the second positioning member 28 is the beam 17 located at the position corresponding to the lower end portion of the cover member 3, out of the plurality of back-face-side frame portions 16, and the upward-facing surface of the beam 17 serves as the support surface 29. However, there is no limitation to this configuration. For example, a configuration is also possible in which a support member that supports a downward-facing surface of the cover main body portion 43 is fixed to the surface of the beam 17 that faces the back face side X2 in the depth direction, at the position corresponding to the lower end portion of the cover member 3, and the support member serves as the second positioning member 28.

(4) In the above embodiment, a configuration is described as an example in which the placement section accessory members 30 are the reflective plate portions 24 of the article detection sensor 32. However, there is no limitation to this configuration, and the placement section accessory members 30 may be any members provided in correspondence with the plurality of placement sections 10. For example, the placement section accessory members 30 may be members constituting various sensors, piping members, wiring members, reinforcing members for securing the strength of the placement sections 10, or the like.

(5) In the above embodiment, a configuration is described as an example in which the plurality of placement section accessory members 30 are attached to the surface of the cover member 3 that faces the front face side X1 in the depth direction, at the positions respectively corresponding to the plurality of placement sections 10. However, there is no limitation to this configuration, and a configuration is also possible in which the plurality of placement section accessory members 30 are attached only at positions corresponding to some placement sections 10 among the plurality of placement sections 10.

(6) In the above embodiment, a configuration is described as an example in which the cover member 3 is detachably fixed to the back-face-side frame portions 16. However, there is no limitation to this configuration, and the cover member 3 may be detachably fixed to a portion of the frame member 6 other than the back-face-side frame portions 16.

(7) The configurations disclosed in each embodiment described above (including the above embodiment and the other embodiments, the same applies hereinafter) can be applied in combination with configurations disclosed in other embodiments so long as no contradiction arises. The embodiments disclosed in the present specification including the other configurations are examples in all aspects, and can be modified as appropriate within a range not departing from the gist of the present disclosure.

6. Outline of the Above Embodiment

The following describes an outline of the automated warehouse described above.

An automated warehouse including: a storage rack configured to store a plurality of articles; and a transport apparatus configured to travel along a front face of the storage rack and transport the articles, wherein the storage rack includes: a plurality of placement sections on which the articles are placeable; a frame member supporting the plurality of placement sections; a plurality of placement section accessory members respectively corresponding to the plurality of placement sections; and a cover member, the cover member covers a target region set in a portion of a back face of the storage rack or over an entirety of the back face, the plurality of placement sections are next to each other in both an up-down direction and a width direction orthogonal to the up-down direction as viewed in a depth direction that is a direction from the front face toward the back face or from the back face toward the front face, and storage regions in which the articles are storable are respectively formed between pairs of two placement sections adjacent to each other in the up-down direction, the cover member is changeable between a closed state in which the cover member covers the target region and an open state in which the cover member has been moved relative to the frame member to expose the target region, the placement section accessory members are on a back face side in the depth direction relative to the storage regions formed on the corresponding placement sections, are on a front face side in the depth direction relative to the cover member, and overlap the storage regions as viewed in the depth direction, the back face side in the depth direction being the back face side as seen from the front face side in the depth direction, and the front face side in the depth direction being the front face side as seen from the back face side in the depth direction, and the plurality of placement section accessory members are fixed to the cover member so that the placement section accessory members move relative to the frame member as the state of the cover member is changed from the closed state to the open state.

In general, in a case where the back face of a storage rack is covered with a cover member, it is difficult to take out articles from the storage rack when a transport apparatus has stopped due to breakdown or a power failure, for example. However, according to this configuration, the cover member covering the back face of the storage rack is changeable between the closed state in which the cover member covers the target region relative to the frame member and the open state in which the cover member has been moved relative to the frame member to expose the target region. Accordingly, when the cover member is changed to the open state, articles placed on the placement sections can be taken out from the back face side of the storage rack.

Here, if the placement section accessory members are fixed to the placement sections, the placement section accessory members hinder taking out articles from the back face side. However, according to this configuration, the placement section accessory members are fixed to the cover member and move relative to the frame member as the state of the cover member is changed. Accordingly, when the cover member is in the open state, the placement section accessory members are also shifted from their positions in the closed state relative to the frame member, and do not hinder taking out articles from the back face side of the storage rack.

Therefore, the articles can be taken out relatively easily even in case of emergency, such as a case where the transport apparatus has stopped due to breakdown or a power failure, for example.

Here, it is preferable that the frame member is provided with a positioning mechanism configured to define an attachment position of the cover member.

According to this configuration, the cover member can be kept from being displaced from a proper position when the state of the cover member is once changed to the open state and again changed to the closed state. Therefore, it is possible to avoid displacement of the placement section accessory members due to a change in the state of the cover member even in cases where the positions of the placement section accessory members are important, such as a case where the placement section accessory members constitute a sensor and a case where the placement section accessory members are used for positioning articles.

It is preferable that the positioning mechanism includes: a plurality of first positioning members configured to define the attachment position of the cover member relative to the frame member in the width direction; and a second positioning member configured to define the attachment position of the cover member relative to the frame member in the up-down direction, the first positioning members include widthwise abutting surfaces respectively abutting against two side edges of the cover member in the width direction, and the second positioning member includes a support surface facing upward and configured to support a downward-facing supported surface of the cover member.

According to this configuration, the cover member attached to the storage rack can be appropriately positioned relative to the frame member in the width direction and the up-down direction. Accordingly, it is possible to avoid displacement of the cover member and the placement section accessory members due to a change in the state of the cover member between the open state and the closed state.

It is preferable that the placement section accessory members constitute an article detection sensor configured to detect presence or absence of the articles placed on the placement sections.

An article detection sensor for detecting the presence or absence of an article placed on a placement section is sometimes used to avoid a situation in which the transport apparatus operates by mistake to place an article on a placement section on which another article has already been placed. In such a case, in order to detect articles with high accuracy with use of the article detection sensor, members constituting the article detection sensor are sometimes disposed on the back face side in the depth direction relative to storage regions corresponding to the respective placement sections, at positions where the members overlap the storage regions as viewed in the depth direction.

Even in such a case, according to this configuration, the members constituting the article detection sensor can be kept from hindering taking out articles from the back face side.

It is preferable that the placement section accessory members are attached to a surface of the cover member, which surface faces the front face side in the depth direction, at positions respectively corresponding to the plurality of placement sections.

According to this configuration, when the state of the cover member is changed to the closed state in which the cover member covers the target region, the placement section accessory members fixed to the cover member are disposed at the positions respectively corresponding to the plurality of placement sections. Therefore, even when the state of the cover member is changed to the open state and thereafter changed again to the closed state, the placement section accessory members can be disposed at proper positions relative to the plurality of placement sections.

It is preferable that the frame member includes a back-face-side frame portion on the back face side in the depth direction relative to the plurality of storage regions, and the cover member is detachably fixed to the back-face-side frame portion or swingably supported by the back-face-side frame portion.

According to this configuration, the cover member can be relatively easily attached to and detached from the frame member or the cover member can be relatively easily operated so as to swing relative to the frame member.

INDUSTRIAL APPLICABILITY

The techniques according to the present disclosure are applicable to automated warehouses.

What is claimed is:
1. An automated warehouse comprising:
a storage rack configured to store a plurality of articles; and a transport apparatus configured to travel along a front face of the storage rack and transport the articles, wherein the storage rack comprises:
- a plurality of placement sections on which the articles are placeable;
- a frame member supporting the plurality of placement sections;
- a plurality of placement section accessory members respectively corresponding to the plurality of placement sections; and
- a cover member, wherein:

the cover member covers a target region set in a portion of a back face of the storage rack or over an entirety of the back face, the plurality of placement sections are next to each other in both an up-down direction and a width direction orthogonal to the up-down direction as viewed in a depth direction that is a direction from the front face toward the back face or from the back face toward the front face, and storage regions in which the articles are storable are respectively formed between pairs of two placement sections adjacent to each other in the up-down direction, the cover member is changeable between a closed state in which the cover member covers the target region and an open state in which the cover member has been moved relative to the frame member to expose the target region, the placement section accessory members constitute an article detection sensor configured to detect presence or absence of the articles placed on the placement sections, and are on a back face side in the depth direction relative to the storage regions formed on the corresponding placement sections, are on a front face side in the depth direction relative to the cover member, and overlap the storage regions as viewed in the depth direction, the back face side in the depth direction is the back face side as seen from the front face side in the depth direction, and the front face side in the depth direction is the front face side as seen from the back face side in the depth direction, and the plurality of placement section accessory members are fixed to the cover member so that the placement section accessory members move relative to the frame member as the state of the cover member is changed from the closed state to the open state.

2. The automated warehouse according to claim 1, wherein the frame member is provided with a positioning mechanism configured to define an attachment position of the cover member.

3. The automated warehouse according to claim 2, wherein the positioning mechanism comprises:
- a plurality of first positioning members configured to define the attachment position of the cover member relative to the frame member in the width direction; and
- a second positioning member configured to define the attachment position of the cover member relative to the frame member in the up-down direction, wherein the first positioning members include widthwise abutting surfaces respectively abutting against two side edges of the cover member in the width direction, and wherein the second positioning member includes a support surface facing upward and configured to support a downward-facing supported surface of the cover member.

4. The automated warehouse according to claim 1, wherein the placement section accessory members are attached to a surface of the cover member, which surface faces the front face side in the depth direction, at positions respectively corresponding to the plurality of placement sections.

5. The automated warehouse according to claim 1, wherein the frame member comprises a back-face-side frame portion on the back face side in the depth direction relative to the plurality of storage regions, and wherein the cover member is detachably fixed to the back-face-side frame portion or swingably supported by the back-face-side frame portion.

6. The automated warehouse according to claim 3, wherein the cover member includes a cover main body portion covering the target region, and a supported portion, wherein the supported portion protrudes toward the front face side in the depth direction from the cover main body portion in a lower end portion of the cover main body portion, wherein the supported surface is a surface facing downward of the supported portion, wherein a cover main body lower portion is a portion of the cover main body portion below the supported portion, and wherein when the supported surface is in contact with the support surface, a surface of the cover main body lower portion of the cover main body portion facing the front face side in the depth direction abuts against a surface of the second positioning member facing the back face side in the depth direction.

* * * * *